United States Patent
Sutardja

(10) Patent No.: US 7,760,029 B2
(45) Date of Patent: *Jul. 20, 2010

(54) HIGH-BANDWIDTH HIGH-GAIN AMPLIFIER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/217,753

(22) Filed: Jul. 8, 2008

(65) Prior Publication Data

US 2009/0051432 A1    Feb. 26, 2009

Related U.S. Application Data

(63) Continuation of application No. 11/528,033, filed on Sep. 27, 2006, now Pat. No. 7,397,310, which is a continuation of application No. 11/339,020, filed on Jan. 25, 2006, now Pat. No. 7,388,436.

(60) Provisional application No. 60/732,497, filed on Nov. 2, 2005.

(51) Int. Cl.
    *H03F 3/68* (2006.01)
(52) U.S. Cl. ...................................... 330/311
(58) Field of Classification Search ................. 330/253, 330/311
    See application file for complete search history.

(56) References Cited

U.S. PATENT DOCUMENTS

| | | | |
|---|---|---|---|
| 4,970,470 A | 11/1990 | Gosser | |
| 5,392,000 A * | 2/1995 | Gillig | ........................ 330/107 |
| 5,410,274 A | 4/1995 | Birdsall et al. | |
| 5,581,212 A | 12/1996 | Huang et al. | |
| 5,764,176 A | 6/1998 | Ginetti | |
| 6,124,818 A | 9/2000 | Thomas et al. | |
| 6,304,206 B1 | 10/2001 | Wada et al. | |
| 6,441,769 B1 | 8/2002 | Niagaraj | |
| 6,577,185 B1 * | 6/2003 | Chandler et al. | ............... 330/9 |
| 6,683,554 B2 | 1/2004 | Nikai et al. | |
| 6,762,644 B1 | 7/2004 | Sutardja | |
| 6,778,010 B1 | 8/2004 | Michalski | |
| 6,977,606 B2 | 12/2005 | Daito | |
| 7,023,271 B1 | 4/2006 | Aram | |

(Continued)

OTHER PUBLICATIONS

USPTO Non-Final Office Action mailed Jul. 21, 2006 for U.S. Appl. No. 11/339,020, filed Jan. 25, 2006.

(Continued)

*Primary Examiner*—Steven J Mottola

(57) ABSTRACT

A pipelined analog to digital converter includes a first stage that receives an input voltage, that generates a first sampled digital value and a first residue voltage, and that includes a first amplifier that amplifies the first residue voltage and generates a first amplified residue voltage. A second stage receives the first amplified residue voltage, generates a second sampled digital value and a second residue voltage, and includes a second amplifier that amplifies the second residue voltage. At least one of the first amplifier and the second amplifier comprises a first transistor having a control terminal, a first terminal, and a second terminal, a second transistor having a control terminal, a first terminal, and a second terminal that communicates with the second terminal of the first transistor, a differential transimpedance amplifier and a differential output amplifier.

15 Claims, 16 Drawing Sheets

U.S. PATENT DOCUMENTS

| | | | |
|---|---|---|---|
| 7,276,965 | B1 | 10/2007 | Sutardja |
| 7,417,575 | B2 | 6/2008 | Sutardja |
| 7,397,306 | B2 | 7/2008 | Sutardja |
| 7,397,310 | B2 | 7/2008 | Sutardja |
| 7,388,436 | B2 | 8/2008 | Sutardja |
| 2002/0005974 | A1 | 1/2002 | Ohhata et al. |
| 2004/0164807 | A1 | 8/2004 | Cove |

OTHER PUBLICATIONS

Amendment filed Feb. 21, 2007 in response to USPTO Non-Final Office Action mailed Nov. 21, 2006 for U.S. Appl. No. 11/339,020, filed Jan. 25, 2006.
USPTO Non-Final Office Action mailed Mar. 13, 2007 for U.S. Appl. No. 11/339,020, filed Jan. 25, 2006.
Amendment filed Aug. 9, 2007 in response to USPTO Non-Final Office Action mailed Mar. 13, 2007 for U.S. Appl. No. 11/339,020, filed Jan. 25, 2006.
USPTO Non-Final Office Action mailed Nov. 21, 2006 for U.S. Appl. No. 11/527,983, filed Sep. 27, 2006.
Amendment filed Feb. 21, 2007 in response to USPTO Non-Final Office Action mailed Nov. 21, 2006 for U.S. Appl. No. 11/527,983, filed Sep. 27, 2006.
USPTO Non-Final Office Action mailed Mar. 14, 2007 for U.S. Appl. No. 11/527,983, filed Sep. 27, 2006.
Amendment filed Aug. 9, 2007 in response to USPTO Non-Final Office Action mailed Mar. 14, 2007 for U.S. Appl. No. 11/527,983, filed Sep. 27, 2006.
USPTO Non-Final Office Action mailed Aug. 13, 2007 for U.S. Appl. No. 11/528,034, filed Sep. 27, 2006.
Amendment filed Nov. 9, 2007 in response to USPTO Non-Final Office Action mailed Aug. 13, 2007 for Application No. 11/528,034 filed Sep. 27, 2006.
USPTO Non-Final Office Action mailed Apr. 26, 2007 for U.S. Appl. No. 11/528,033, filed Sep. 27, 2006.
Amendment filed Aug. 8, 2007 in response to USPTO Non-Final Office Action mailed Apr. 26, 2007 for U.S. Appl. No. 11/528,033, filed Sep. 27, 2006.
U.S. Appl. No. 11/037,733, Tan, Kee Hian.
Ahadian, J. et al; "A Quad 2.7 Gb/s Parallel Optical Transceiver"; Radio Frequency Integrated Circuits (RFIC) Symposium, 2004, Jun. 6, 2004; pp. 13-16.
Application of the Operational Transconductance Amplifier (OTA) to Voltage-controlled Amplifiers and Active Filters; W. Grise; w.grise@morehead-st.edu; Department of IET, Morehead State University; Morehead, KY; 10 pages, Oct. 31, 2005.
EPO Communication and Extended Search Report dated Nov. 7, 2007 for European Patent Application No. 06 022 864.0, 10 pages.
EPO Communication and Extended Search Report dated Nov. 7, 2007 for European Patent Application No. 06 022 702.2, 10 pages.
IEEE Journal of Solid State Circuits, vol. 23, No. 6, Dec. 1988. A Pipelined 13-bit, 250-ks/s, 5-V Analog-to-Digital Converter; Sehat Sutardja and Paul R. Gray, Fellow, IEEE. pp. 1316-1323.
Muellrich, J. et al; "High-Gain Transimpedance Amplifier in InP-Based HBT Technology for the Receiver in 40-Gb/s Optical-Fiber TDM Links"; IEEE Journal of Solid-State Circuits, vol. 35, No. 9, Sep. 2000; pp. 1260-1265.
SA20.4: A ±2.45V-Swing CMOS Telescopic Operational Amplifier; K. Gulati, H-S. Lee, Massachusetts Institute of Technology, Cambridge, MA; IEEE 1998; 7 pages.
Session XV: A/D Conversion; FAM 15.5: A 250ks/s 13b Pipelined A/D Converter; Sehat Sutardja, Paul R. Gray; Electronics Research Laboratory; University of California, Berkeley, CA. pp. 228-230, Feb. 1988.
Taherzadeh, S. M. et al; "Pseudo-class-AB telescopic-cascode operational amplifier"; Electronics Letters, IEE Stevenage, GB, vol. 40, No. 4, Feb. 19, 2004; on pp. 219-221.
What's All This Tranimpedance Amplifer Stuff, Anyhow? (Part 1); Bob Pease; Electronic Design; Jan. 8, 2001; 12 pages.
A 10-b, 80 Msamples/s, 87 mW, Pipeline Analog to Digital Converter; Rimal Deep Singh, Shreya M. Shah and Harmander Singh Deogun; 6 pages; Jan. 2003.
ES154 - Lecture 13, "High-Gain Differential Amplifier Design"; Gu-Yeon Wei, Division of Engineering and Applied Sciences; Harvard University, guyeon@eecs.harvard.edu; pp. 1-21; Nov. 2002.

\* cited by examiner

US 7,760,029 B2

HIGH-BANDWIDTH HIGH-GAIN AMPLIFIER

CROSS-REFERENCE TO RELATED APPLICATIONS

This application is a continuation of U.S. patent application Ser. No. 11/528,033, filed Sep. 27, 2006, which is a continuation of U.S. patent application Ser. No. 11/339,020 filed Jan. 25, 2006, which claims the benefit of U.S. Provisional Application No. 60/732,497, filed Nov. 2, 2005. The disclosures of the above applications are incorporated herein by reference in their entirety.

FIELD OF THE INVENTION

The present invention relates to amplifiers, and more particularly to multi-stage amplifiers.

BACKGROUND OF THE INVENTION

One method for increasing bandwidth of an operational amplifier (opamp) is to use a low-gain, high-bandwidth amplifier as an input amplifier preceding a regular opamp, which forms a composite opamp. For example, one suitable composite opamp is described in "A Pipelined 13-bit, 250-ks/s, 5-V Analog-to-Digital Converter," Sehat Sutardja and Paul Gray, IEEE Journal of Solid-State Circuits (1988), which is hereby incorporated by reference in its entirety. The low-gain input amplifier of the composite opamp may be implemented using a $g_m*R$ or $g_m/g_m$ configuration. That is, the input amplifier uses a resistor or a transistor as a load. This input amplifier, however, has a limited gain bandwidth product.

Referring now to FIGS. 1 and 2, a composite opamp 10 includes a transistor 14 having a gate coupled to an input voltage $V_{in}$. One terminal of the transistor 14 is coupled to a current source 18. A second terminal of the transistor 14 is coupled to a resistive load or resistor 16 and to a gate of a transistor 20. The resistor 16 and a first terminal of the transistor 20 are biased by a voltage source $V_{dd}$. A second terminal of the transistor 20, which acts as a follower, is coupled to an opamp 30. In FIG. 2, the resistor 16 may be replaced by an active load or a transistor 38 such as a diode-connected transistor.

SUMMARY OF THE INVENTION

An amplifier circuit comprises a first transistor having a control terminal that receives a first amplifier input, a first terminal, and a second terminal. The amplifier circuit comprises a transimpedance amplifier having an input that communicates with the first terminal of the first transistor, and an output. The amplifier circuit comprises an output amplifier having an input that communicates with the output of the transimpedance amplifier and an output. The amplifier circuit comprises a first load that communicates with the first terminal of the first transistor and a current source that communicates with the second terminal of the first transistor.

In other features, the transimpedance amplifier comprises a nested transimpedance amplifier.

In other feature, the output amplifier comprises an operational amplifier.

In still other features, the output amplifier comprises a telescopic cascoded amplifier.

In other features, the telescopic cascoded amplifier comprises an input transistor having a control terminal that communicates with the output of the transimpedance amplifier, a first terminal, and a second terminal. The telescopic cascoded amplifier comprises an output transistor having a first terminal that communicates with the second terminal of the input transistor, a control terminal, and a second terminal that communicates with the output of the output amplifier. The telescopic cascoded amplifier comprises an output current source having a first terminal that communicates with the second terminal of the output transistor, and a second terminal.

In other features, the output amplifier comprises a push-pull amplifier.

In still other features, the amplifier comprises a second transistor having a control terminal that receives a second amplifier input, a first terminal, and a second terminal that communicates with the second terminal of the first transistor. The amplifier circuit comprises a differential transimpedance amplifier having a first input that communicates with the first terminal of the first transistor, a second input that communicates with the first terminal of the second transistor, a first output, and a second output. The amplifier circuit comprises a differential output amplifier having a first input that communicates with the first output of the differential transimpedance amplifier, a second input that communicates with the second output of the differential transimpedance amplifier, a first output, and a second output. The amplifier comprises a second load that communicates with the first terminal of the second transistor.

In other features, the differential transimpedance amplifier comprises a nested differential transimpedance amplifier.

In still other features, the differential output amplifier comprises a differential operational amplifier.

In other features, the differential output amplifier comprises a differential telescopic cascoded amplifier.

In still other features, the differential output amplifier comprises a differential push-pull amplifier.

In other features, an analog-to-digital converter (ADC) comprises N cascaded ADC stages, where N is a integer, wherein at least one of the cascaded ADC stages comprises the amplifier circuit.

In still other features, the amplifier circuit comprises a first transistor having a control terminal that receives a first amplifier input, a first terminal, and a second terminal. The amplifier circuit comprises a second transistor having a control terminal that receives a second amplifier input, a first terminal, and a second terminal that communicates with the second terminal of the first transistor. The amplifier circuit comprises a differential transimpedance amplifier having a first input that communicates with the first terminal of the first transistor, a second input that communicates with the first terminal of the second transistor, a first output, and a second output. The amplifier circuit comprises a differential output amplifier having a first input that communicates with the first output of the differential transimpedance amplifier, a second input that communicates with the second output of the differential transimpedance amplifier, a first output, and a second output. The amplifier circuit comprises a first load that communicates with the first terminal of the first transistor, a current source that communicates with the second terminal of the first transistor, and a second load that communicates with the first terminal of the second transistor.

In other features, the differential transimpedance amplifier comprises a nested differential transimpedance amplifier.

In still other features, the differential output amplifier comprises a differential operational amplifier.

In another feature, the differential output amplifier comprises a differential telescopic cascoded amplifier.

In yet other feature, the differential output amplifier comprises a differential push-pull amplifier.

In yet other feature, the amplifier circuit comprises a first common-mode feedback circuit that communicates with the differential transimpedance amplifier. The first common-mode feedback circuit generates current based on a first voltage at the first output of the differential transimpedance amplifier and a second voltage at the second output of the differential transimpedance amplifier. The first common-mode feedback circuit injects the current into the first input of the differential transimpedance amplifier and into the second input of the differential transimpedance amplifier.

In still other features, the amplifier circuit comprises a second common-mode feedback circuit that communicates with the second terminal of the second transistor. The second common-mode feedback circuit generates current based on a first voltage at the first output of the differential transimpedance amplifier and a second voltage at the second output of the differential transimpedance amplifier. The second common-mode feedback circuit selectively injects the current into the first input of the differential transimpedance amplifier and into the second terminal of the second transistor.

In still other features, the amplifier circuit comprises a first complimentary transistor that is complementary to the first transistor, having a first terminal, a second terminal, and a control terminal that communicates with the control terminal of the first transistor. The amplifier circuit comprises a second complementary transistor that is complementary to the second transistor, having a first terminal that communicates with the first terminal of the first complimentary transistor, a second terminal, and a control terminal that communicates with the control terminal of the second transistor. The amplifier circuit comprises a complementary differential transimpedance amplifier comprising transistors that are complimentary to transistors in the differential transimpedance amplifier, having a first input that communicates with the second terminal of the first complementary transistor, a second input that communicates with the second terminal of the second complementary transistor, a first output, and a second output. The amplifier circuit comprises a complementary differential output amplifier comprising transistors that are complimentary to transistors in the differential output amplifier, having a first input that communicates with the first output of the complementary differential amplifier, a second input that communicates with the second output of the complementary differential amplifier, a first output that communicates with the first output of the differential output amplifier, and a second output that communicates with the second output of the differential output amplifier. The amplifier circuit comprises a third common-mode feedback circuit that selectively injects current into the first terminal of the first complementary transistor. The amplifier circuit comprises a third load that communicates with the second terminal of the first complementary transistor, a current source that communicates with the first terminal of the first complementary transistor, and a fourth load that communicates with the second terminal of the second complementary transistor.

In another feature, the third common-mode feedback circuit comprises an operational transimpedance amplifier that compares a predetermined common-mode output voltage to a sum of a first voltage at the first output of the differential output amplifier and a second voltage at the second output of the differential output amplifier. The third common-mode feedback circuit selectively injects current into the second terminal of the first complimentary transistor and into the second terminal of the second complimentary transistor.

In still other features, an analog-to-digital converter (ADC) comprising N cascaded ADC stages, where N is a positive integer, wherein at least one of the cascaded ADC stages comprises the amplifier circuit.

In still other features, a pipelined analog to digital converter comprises a first stage that receives an input voltage, that generates a first sampled digital value and a first residue voltage, and that includes a first amplifier that amplifies the first residue voltage and generates a first amplified residue voltage. The pipelined analog to digital converter comprises a second stage that receives the first amplified residue voltage, that generates a second sampled digital value and a second residue voltage, and that includes a second amplifier that amplifies the second residue voltage. At least one of the first amplifier and the second amplifier comprises a first transistor having a control terminal, a first terminal, and a second terminal. At least one of the first amplifier and the second amplifier comprises a transimpedance amplifier having an input that communicates with the first terminal of the first transistor, and an output. At least one of the first amplifier and the second amplifier comprises an output amplifier having an input that communicates with the output of the transimpedance amplifier, and an output. At least one of the first amplifier and the second amplifier further comprises a first load that communicates with the first terminal of the first transistor. At least one of the first amplifier and the second amplifier further comprises a current source that communicates with the second terminal of the first transistor.

In other features, the transimpedance amplifier comprises a nested transimpedance amplifier.

In still other features, the output amplifier comprises an operational amplifier.

In still other features, the output amplifier comprises a telescopic cascoded amplifier.

In another feature, the telescopic cascoded amplifier comprises an input transistor having a control terminal that communicates with the output of the transimpedance amplifier, a first terminal, and a second terminal. The telescopic cascoded amplifier comprises an output transistor having a first terminal that communicates with the second terminal of the input transistor, a control terminal, and a second terminal that communicates with the output of the output amplifier. The telescopic cascoded amplifier comprises an output current source with a first terminal that communicates with the second terminal of the output transistor, and a second terminal.

In another feature, the output amplifier comprises a push-pull amplifier.

In still other features, at least one of the first amplifier and the second amplifier comprises a second transistor having a control terminal that receives a second amplifier input, a first terminal, and a second terminal that communicates with the second terminal of the first transistor. At least one of the first amplifier and the second amplifier comprises a differential transimpedance amplifier having a first input that communicates with the first terminal of the first transistor, a second input that communicates with the first terminal of the second transistor, a first output, and a second output. At least one of the first amplifier and the second amplifier comprises a differential output amplifier having a first input that communicates with the first output of the differential transimpedance amplifier, a second input that communicates with the second output of the differential transimpedance amplifier, a first output, and a second output. At least one of the first amplifier and the second amplifier further comprises a second load that communicates with the first terminal of the second transistor.

In other features, the differential transimpedance amplifier comprises a nested differential transimpedance amplifier.

In still other features, the differential output amplifier comprises a differential operational amplifier.

In yet other feature, the differential output amplifier comprises a differential telescopic cascoded amplifier.

In still other features, the differential output amplifier comprises a differential push-pull amplifier.

In still other features, a pipelined analog to digital converter comprises a first stage that receives an input voltage, that generates a first sampled digital value and a first residue voltage, and that includes a first amplifier that amplifies the first residue voltage and generates a first amplified residue voltage. The pipelined analog to digital converter comprises a second stage that receives the first amplified residue voltage, that generates a second sampled digital value and a second residue voltage, and that includes a second amplifier that amplifies the second residue voltage. At least one of the first amplifier and the second amplifier comprises a first transistor having a control terminal, a first terminal, and a second terminal. At least one of the first amplifier and the second amplifier comprises a second transistor having a control terminal, a first terminal, and a second terminal that communicates with the second terminal of the first transistor. At least one of the first amplifier and the second amplifier comprises a differential transimpedance amplifier having a first input that communicates with the first terminal of the first transistor, a second input that communicates with the first terminal of the second transistor, a first output, and a second output. At least one of the first amplifier and the second amplifier comprises a differential output amplifier having a first input that communicates with the first output of the differential transimpedance amplifier, a second input that communicates with the second output of the differential transimpedance amplifier, a first output, and a second output. At least one of the first amplifier and the second amplifier further comprises a first load that communicates with the first terminal of the first transistor, a current source that communicates with the second terminal of the first transistor, and a second load that communicates with the first terminal of the second transistor.

In another feature, the differential transimpedance amplifier comprises a nested differential transimpedance amplifier.

In another feature, the differential output amplifier comprises a differential operational amplifier.

In another feature, the differential output amplifier comprises a differential telescopic cascoded amplifier.

In another feature, the differential output amplifier comprises a differential push-pull amplifier.

In still other features, the one of the first amplifier and the second amplifier further comprises a first common-mode feedback circuit that communicates with the differential transimpedance amplifier. The first common-mode feedback circuit generates current based on a first voltage at the first output of the differential transimpedance amplifier and a second voltage at the second output of the differential transimpedance amplifier. The first common-mode feedback circuit injects the current into the first input of the differential transimpedance amplifier and into the second input of the differential transimpedance amplifier.

In another feature, the one of the first amplifier and the second amplifier further comprises a second common-mode feedback circuit that communicates with the second terminal of the second transistor. The second common-mode feedback circuit generates current based on a first voltage at the first output of the differential transimpedance amplifier and a second voltage at the second output of the differential transimpedance amplifier. The second common-mode feedback circuit selectively injects the current into the first input of the differential transimpedance amplifier and into the second terminal of the second transistor.

In another feature, at least one of the first amplifier and the second amplifier further comprises a first complimentary transistor that is complementary to the first transistor, having a first terminal, a second terminal, and a control terminal that communicates with the control terminal of the first transistor. At least one of the first amplifier and the second amplifier further comprises a second complementary transistor that is complementary to the second transistor, having a first terminal that communicates with the first terminal of the first complimentary transistor, a second terminal, and a control terminal that communicates with the control terminal of the second transistor. At least one of the first amplifier and the second amplifier further comprises a complementary differential transimpedance amplifier comprising transistors that are complimentary to transistors in the differential transimpedance amplifier, having a first input that communicates with the second terminal of the first complementary transistor, a second input that communicates with the second terminal of the second complementary transistor, a first output, and a second output. At least one of the first amplifier and the second amplifier further comprises a complementary differential output amplifier comprising transistors that are complimentary to transistors in the differential output amplifier, having a first input that communicates with the first output of the complementary differential amplifier, a second input that communicates with the second output of the complementary differential amplifier, a first output that communicates with the first output of the differential output amplifier, and a second output that communicates with the second output of the differential output amplifier. At least one of the first amplifier and the second amplifier further comprises a third common-mode feedback circuit that selectively injects current into the first terminal of the first complementary transistor. At least one of the first amplifier and the second amplifier further comprises a third load that communicates with the second terminal of the first complementary transistor, a current source that communicates with the first terminal of the first complimentary transistor, and a fourth load that communicates with the second terminal of the second complementary transistor.

In another feature, the third common-mode feedback circuit comprises an operational transimpedance amplifier that compares a predetermined common-mode output voltage to a sum of a first voltage at the first output of the differential output amplifier and a second voltage at the second output of the differential output amplifier. The third common-mode feedback circuit injects current into the second terminal of the first complementary transistor and into the second terminal of the second complimentary transistor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 2:
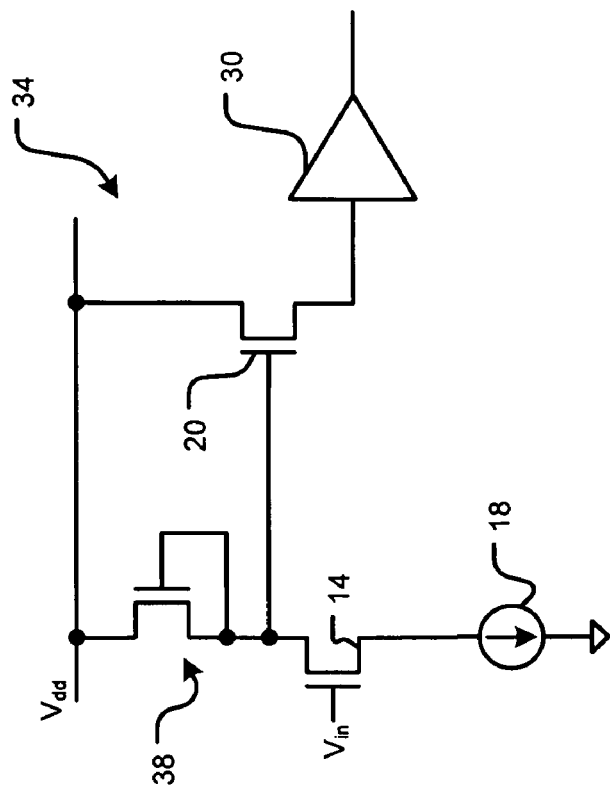
FIG. 2 is an electrical schematic of a composite opamp according to the prior art.
Figure 1:
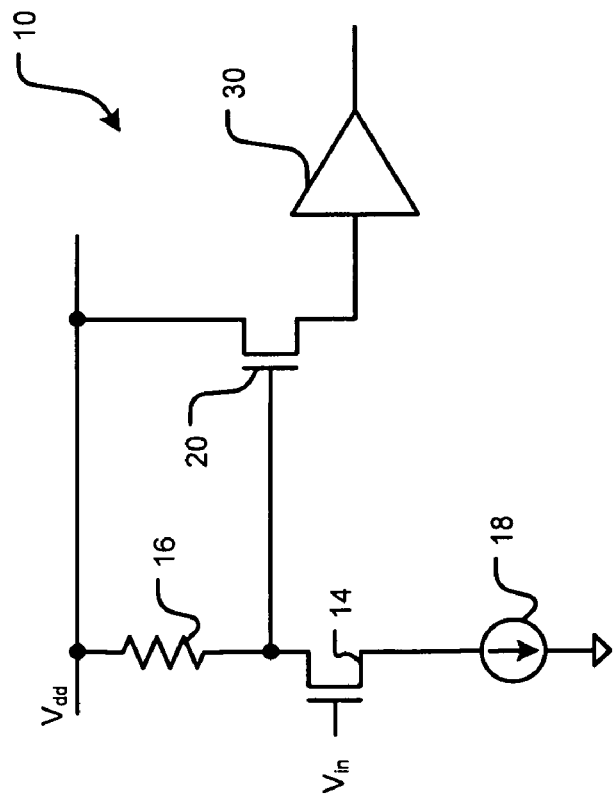
FIG. 1 is an electrical schematic of a composite opamp according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention. While differential and/or single ended amplifiers may be shown for a particular embodiment, all of the foregoing embodiments may be configured in single ended and differential modes.

Figure 3:
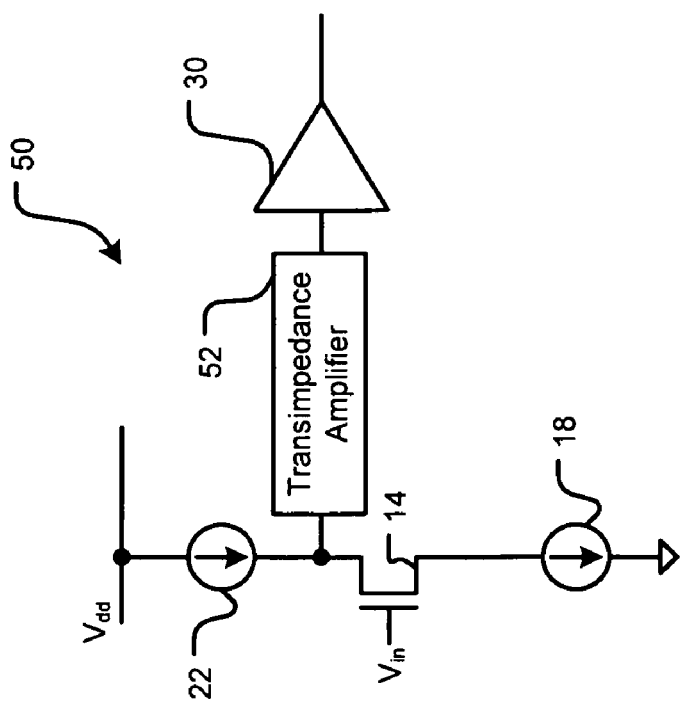
FIG. 3 is an electrical schematic and functional block diagram of an exemplary amplifier including a transimpedance amplifier according to the present invention.

Referring now to FIG. 3, an amplifier 50 comprises a transistor 14 with a load 22. A node between the transistor 14 and the load 22 is directly connected to an input of a transimpedance amplifier 52. An output of the transimpedance amplifier 52 is directly connected to an input of an opamp 30 without a follower. The transimpedance amplifier 52 significantly increases the gain bandwidth (GBW) product of the amplifier 50. For example, a simple transimpedance amplifier may double the GBW product of the amplifier 50. This makes the amplifier 50 suitable for use in very high gain/bandwidth composite amplifiers.

Figure 4:
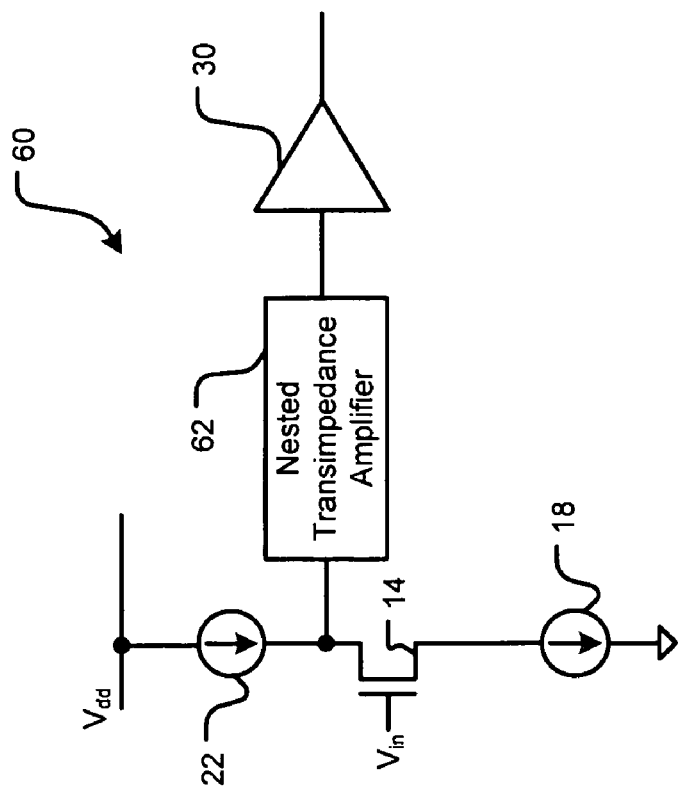
FIG. 4 is an electrical schematic and functional block diagram of an exemplary amplifier including a nested transimpedance amplifier according to the present invention.

Referring now to FIG. 4, an amplifier 60 comprises a nested transimpedance amplifier 62. Using the nested transimpedance amplifier 62 instead of the transimpedance amplifier 52 further increases a GBW product of the amplifier 60. This composite amplifier (or opamp) 60 is suitable for use in multi-bit sub-ranging analog to digital converter (ADC) designs such as those described in "A Pipelined 13-bit, 250-ks/s, 5-V Analog-to-Digital Converter," Sehat Sutardja and Paul Gray, IEEE Journal of Solid-State Circuits (1988). This is because each stage of the converter requires an amplifier with a very high GBW product to resolve a high number of bits per stage. That is, resolution of each stage and the overall resolution of the converter is directly proportional to the GBW product of the amplifier used in each stage.

Nesting suitable transimpedance amplifiers and nested transimpedance amplifiers are shown and described in "Nested Transimpedance Amplifiers," U.S. patent application Ser. No. 10/459,731, filed Jun. 11, 2003, "Variable Gain Constant Bandwidth Transimpedance Amplifier," U.S. patent application Ser. No. 10/814,534, filed Mar. 31, 2004, and "Transimpedance Amplifier," U.S. patent application Ser. No. 11/037,733, filed Jan. 18, 2005, which are hereby incorporated by reference in their entirety.

Figure 5:
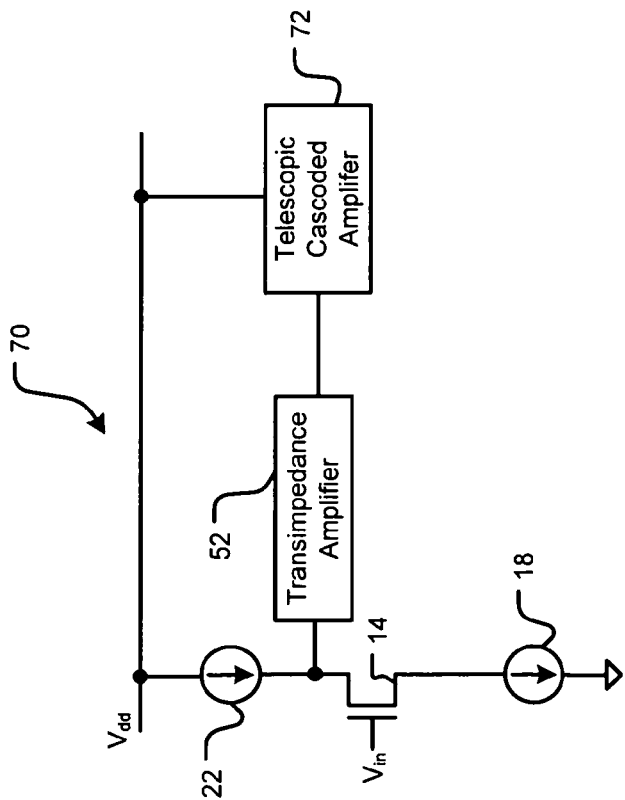
FIG. 5 is an electrical schematic and functional block diagram of an exemplary amplifier including a transimpedance amplifier and a telescopic cascoded amplifier according to the present invention.

Referring now to FIG. 5, an amplifier 70 comprises the transimpedance amplifier 52 and a telescopic cascoded amplifier 72. A telescopic cascoded amplifier typically has a limited input common-mode voltage range. Since a common-mode voltage of a transimpedance amplifier can be made independent of gain, the transimpedance amplifier 52 is very suitable for interfacing with the telescopic cascoded amplifier 72. Additionally, the telescopic cascoded amplifier 72 provides high gain and improved bandwidth without requiring compensation. Therefore, combining the transimpedance amplifier 52 and the telescopic cascoded amplifier 72 or its variants significantly increases a GBW product of the amplifier 70.

Figure 6:
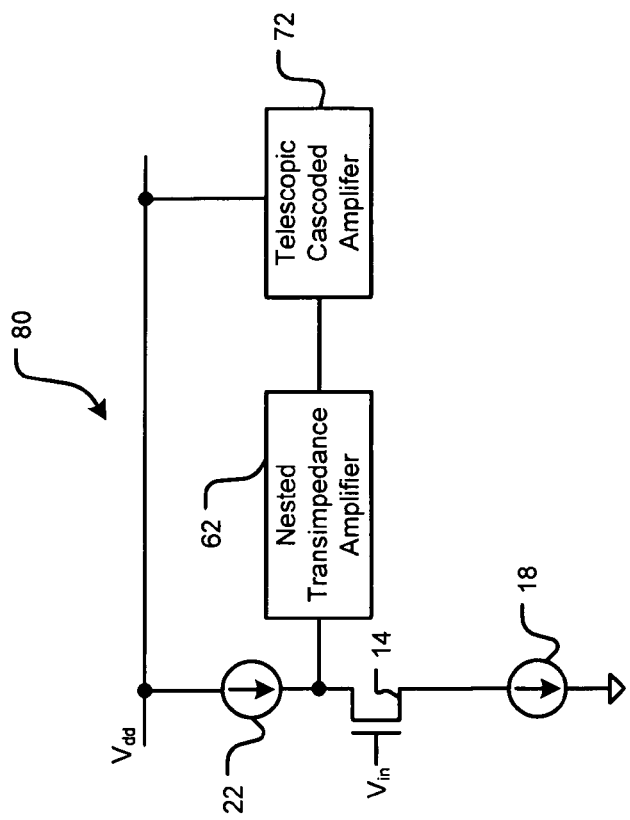
FIG. 6 is an electrical schematic and functional block diagram of an exemplary amplifier including a nested transimpedance amplifier and a telescopic cascoded amplifier according to the present invention.

Referring now to FIG. 6, an amplifier 80 comprises the nested transimpedance amplifier 62 and the telescopic cascoded amplifier 72. Using the nested transimpedance amplifier 62 instead of the transimpedance amplifier 52 further increases a GBW product of the amplifier 80.

Figure 7:
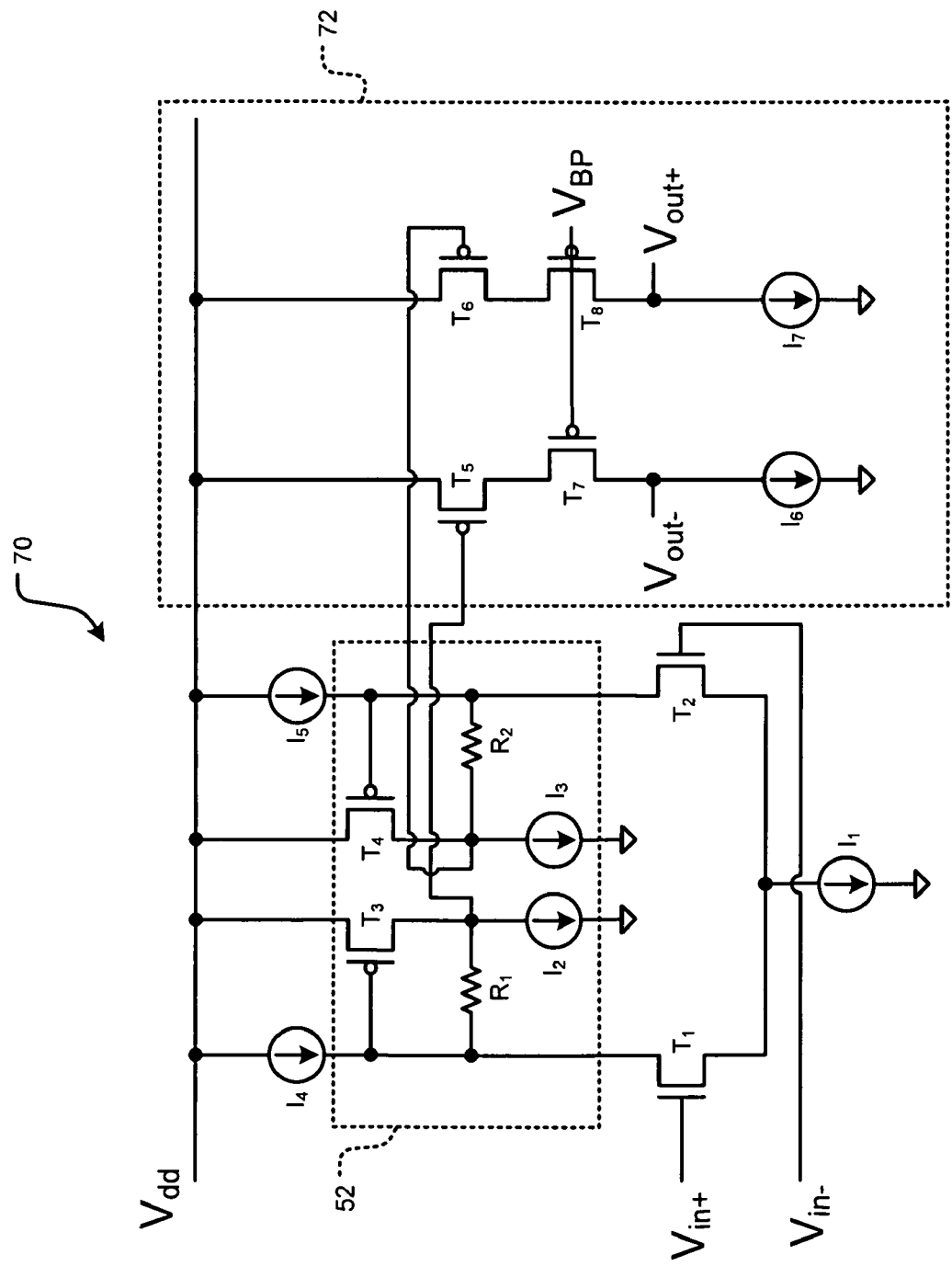
FIG. 7 is a more detailed exemplary electrical schematic of the amplifier of FIG. 5.

Referring now to FIG. 7, an exemplary electrical schematic of a differential implementation of the amplifier 70 is shown. Mismatch may exist among components such as transistors due to various reasons. For example, impurities in substrates and/or doping materials used in manufacturing the components can cause mismatch. Additionally, variations in one or more characteristic of the components due to changes in operating and/or ambient temperature can cause mismatch. Due to the mismatch, some currents, although expected to be equal by design, may not in fact be equal. This can adversely affect a performance characteristic such as the GBW product of the amplifier 70.

Figure 8:
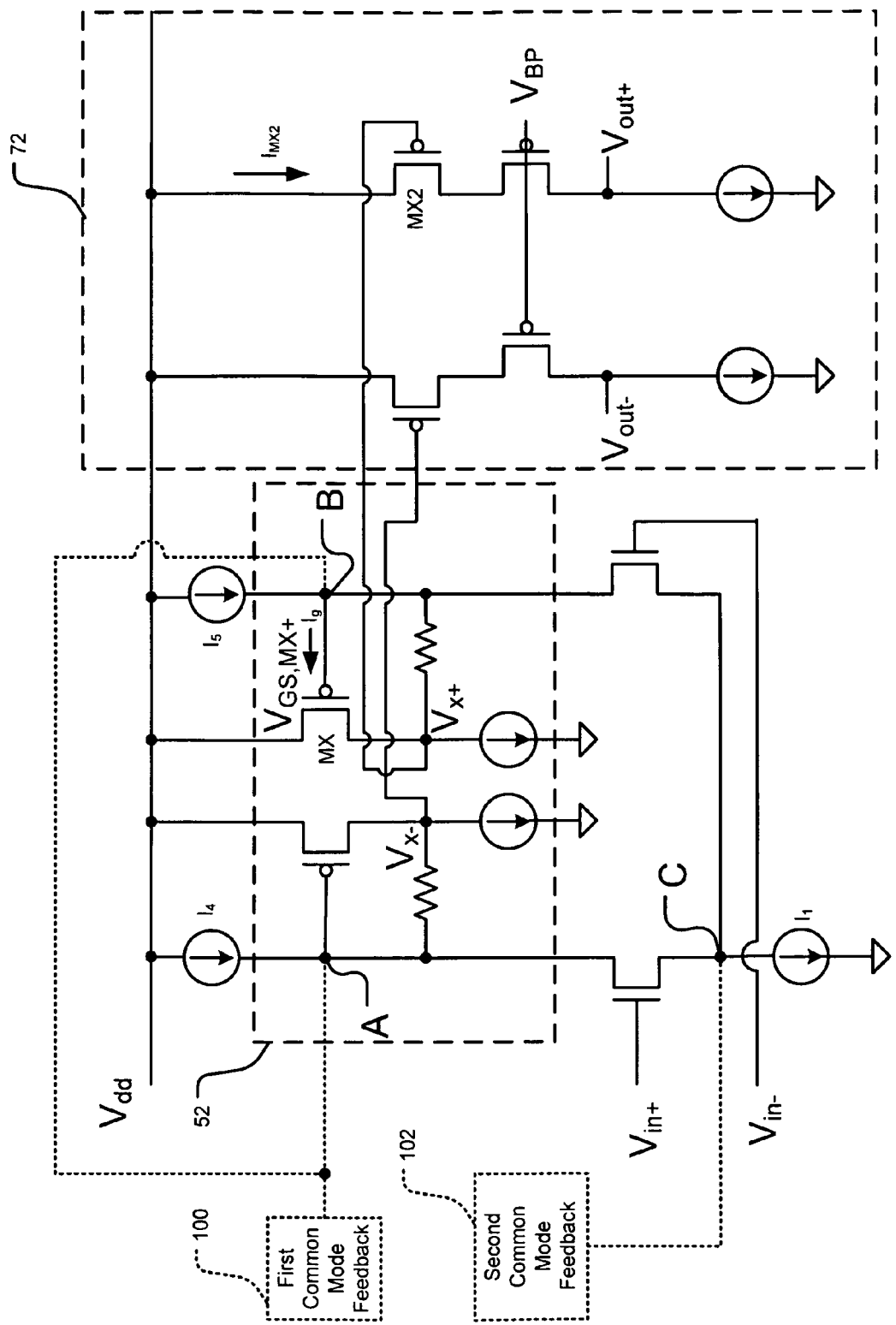
FIG. 8 is an exemplary electrical schematic of the amplifier of FIG. 5 including a common-mode feedback circuit according to the present invention.
Figure 9:
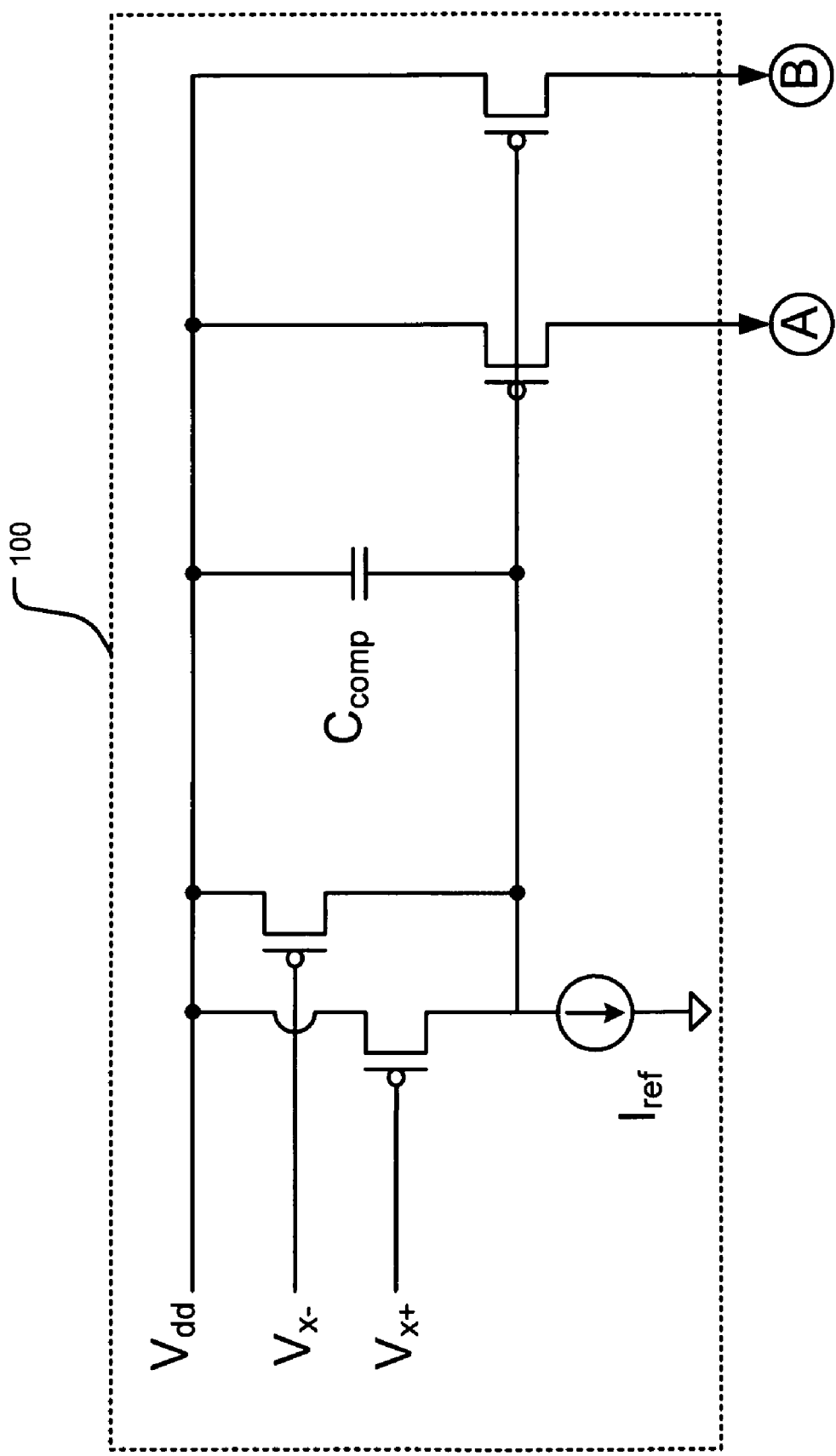
FIG. 9 is an exemplary electrical schematic of a common-mode feedback circuit for use in FIG. 8 according to the present invention.
Figure 10:
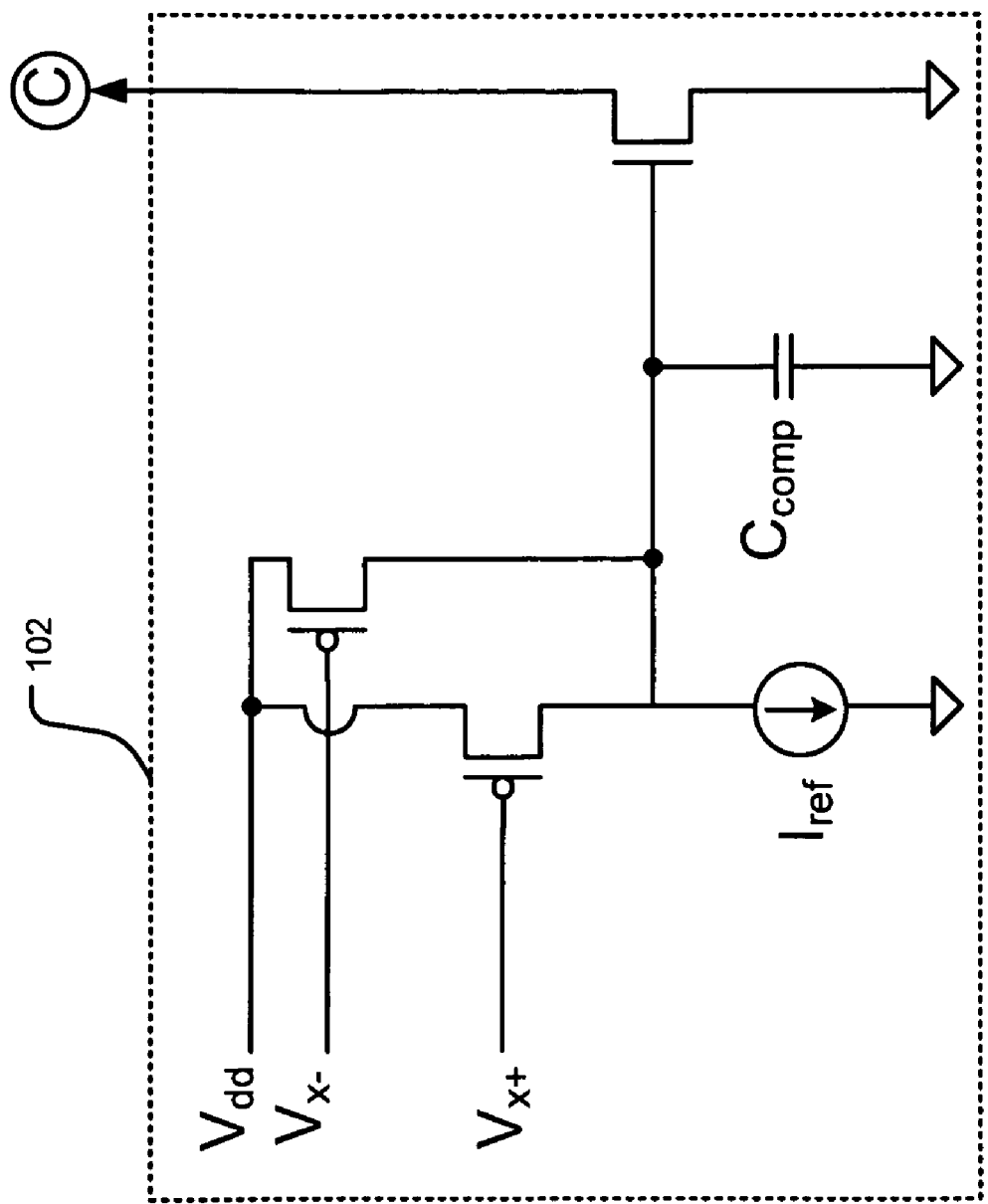
FIG. 10 is an exemplary electrical schematic of a common-mode feedback circuit for use in FIG. 8 according to the present invention.

Referring now to FIGS. 8-10, if the transimpedance amplifier 52 is ideal, where all components are matched, $I_5=I_4=I_1/2$. Practically, however, most components do not match. Therefore, $I_5 \neq I_4$ and $I_g \neq 0$. Therefore, $V_{x+} \neq V_{GS,MX+}$, and $I_{MX2}$ is unknown. Similar results obtain in the other half of the transimpedance amplifier 52.

The mismatch can be compensated by using a common-mode feedback. For example, a first common-mode feedback circuit 100 is used to inject current at points A and B. Alternatively or in addition to circuit 100, a second common-mode feedback circuit 102 can be used to inject current at point C. FIG. 9 shows an exemplary electrical schematic for the first common-mode feedback circuit 100. FIG. 10 shows an exemplary electrical schematic for the second common-mode feedback circuit 102.

Figure 11:
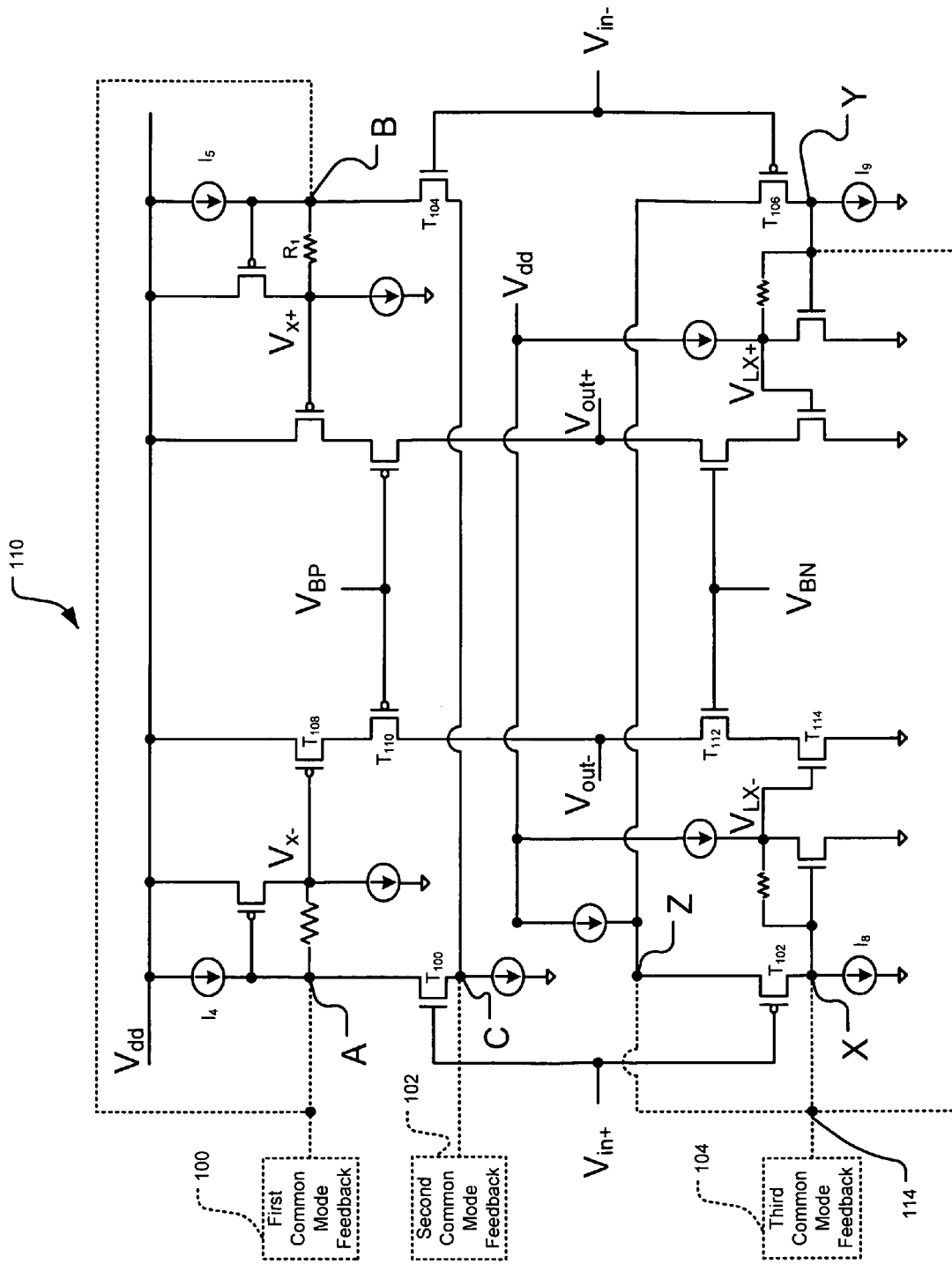
FIG. 11 is an exemplary electrical schematic of a differential implementation of an amplifier using complementary input stages and common-mode feedback according to the present invention.
Figure 12:
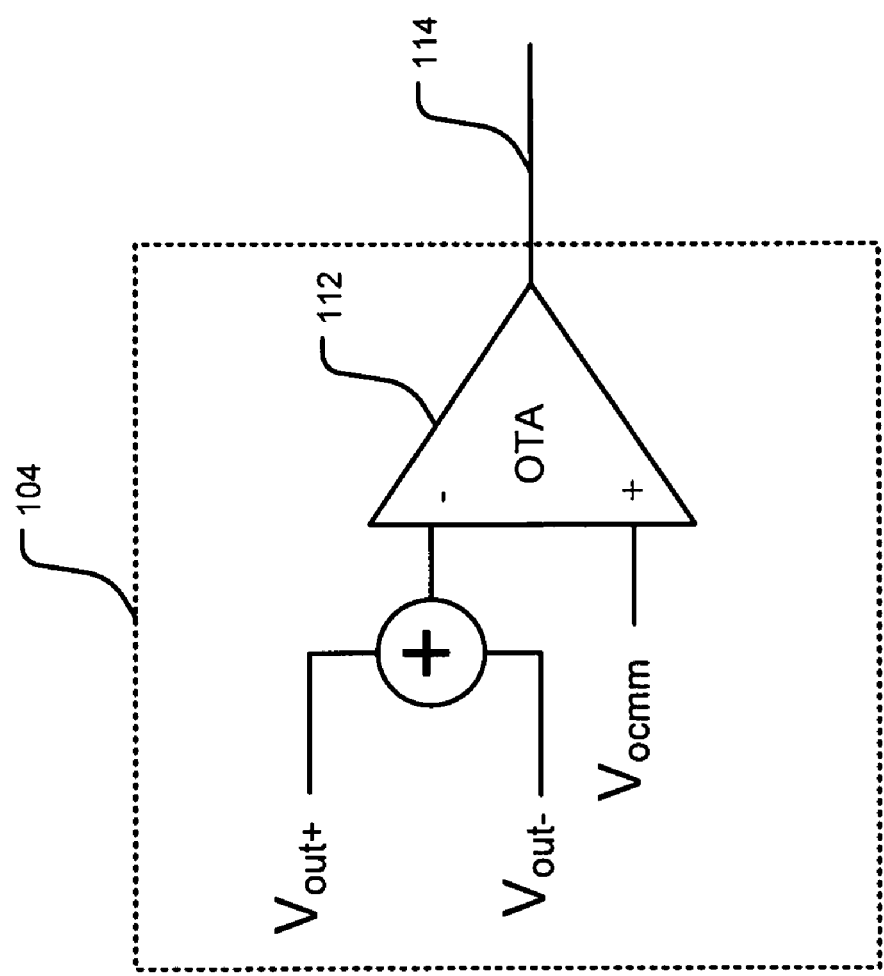
FIG. 12 is an exemplary schematic of a common-mode feedback circuit for use in FIG. 11 according to present invention.

Referring now to FIGS. 11-12, an amplifier 110 is implemented using complementary input stages. Specifically, an input is coupled to a gate of an NMOS input transistor in one stage and to a gate of a PMOS input transistor in another stage. For example, an input $V_{in+}$ is coupled to a gate of an NMOS input transistor $T_{100}$ in an upper input stage and to a gate of a PMOS input transistor $T_{102}$ in a lower input stage. Similarly, an input $V_{in-}$ is coupled to another pair of NMOS and PMOS input transistors $T_{104}$ and $T_{106}$ respectively in another half of the amplifier 110.

Nodes between the input transistors and their respective loads are directly connected to transimpedance amplifiers. For example, for in the upper input stage where the input $V_{in+}$ is coupled to the gate of the NMOS input transistor $T_{100}$, the node between the NMOS input transistor $T_{100}$ and the load $I_4$ is directly connected the input of a transimpedance amplifier. Similarly, in the lower input stage, the node between the PMOS input transistor $T_{102}$ and the load $I_8$ is directly connected an input of a transimpedance amplifier. A similar arrangement exists in the upper and the lower input stages corresponding to the $V_{in-}$ input.

Outputs of the transimpedance amplifiers are shown as $V_{x+}$ and $V_{x-}$ for the upper stage and $V_{LX+}$ and $V_{LX-}$ for the lower stage. The outputs of the transimpedance amplifiers are directly coupled to respective output stages of the amplifier 110 without using followers. For example, in an upper output stage comprising transistors $T_{108}$ and $T_{110}$, the output $V_{x-}$ is coupled directly to a gate of the transistor $T_{108}$.

Upper and lower output stages are complementary as well. For example, the upper output stage in one half of the amplifier 110 comprises PMOS transistors $T_{108}$ and $T_{110}$ while a lower output stage in that half of the amplifier 110 comprises NMOS transistors $T_{112}$ and $T_{114}$. The upper output stage comprising PMOS transistors $T_{108}$ and $T_{110}$ and the lower output stage comprising NMOS transistors $T_{112}$ and $T_{114}$ generate an output $V_{out-}$. Similarly, another pair of complementary output stages in another half of the amplifier 110 generates an output $V_{out+}$.

Mismatch among components of the input stages may occur. For example, a transistor in a transimpedance amplifier in the upper input stage may not match a transistor in a transimpedance amplifier in the lower input stage.

Residual mismatch between bias currents of transistors of an upper output stage and bias currents of transistors of a lower output stage may occur, where the transistors in the upper output stage are complementary to the transistors in the lower output stage. For example, a residual mismatch may exist between bias currents of PMOS transistors $T_{108}$ and $T_{110}$ of the upper output stage and bias currents of NMOS transistors $T_{112}$ and $T_{114}$ output stage bias current of the lower stage. A similar residual mismatch may exist in the other half of the amplifier 110. The residual mismatch may adversely affect the outputs $V_{out+}$ and $V_{out-}$.

The effect of mismatch among the components of the input stages can be compensated using a common-mode feedback. Specifically, the first common-mode feedback 100 circuit is used to inject current at points A and B in the upper input stage and at points X and Y in the lower input stage. Alternatively, the second common-mode feedback circuit 102 can be used to inject current at point C in the upper input stage and at point Z in the lower input stage.

Additionally, a third common-mode feedback circuit 104 may be used to monitor the common-mode output voltages $V_{out+}$ and $V_{out-}$. However, since an output of a transimpedance amplifier is a very low-impedance node, an output common-mode feedback should not be applied at the node.

Therefore, the first common-mode feedback circuit 100 or the second common-mode feedback circuit 102 can be used to inject current at respective points in either the upper or the lower complementary input stage of the amplifier 110. For example, the first common-mode feedback circuit 100 can be used to inject current at points A and B, or the second common-mode feedback circuit 102 can be used to inject current at point C in the upper input stage as shown in FIG. 11. This feedback controls only the PMOS output stage bias current of the upper stage. Still other variations and combinations of the common-mode feedback circuits can be used in addition to those described above.

The third common-mode feedback circuit 104 is used to generate current by sensing common-mode output voltages $V_{out+}$ and $V_{out-}$. This current is used control a common-mode current of the lower input stage so that the NMOS output stage bias current of the lower stage equals the PMOS output current bias current of the upper stage.

In FIG. 12, the third common-mode feedback circuit 104 comprises an OTA 112 that compares a sum of $V_{out+}$ and $V_{out-}$ to a target common-mode output voltage level and generates a feedback current 114. The feedback current 114 is injected either at points X and Y, or at point Z as shown in FIG. 11. This feedback current 114 equalizes the bias currents of the upper PMOS and the lower NMOS output stages. Thus, the residual mismatch between the PMOS output stage bias current and the NMOS output stage bias current is compensated by the feedback current 114.

This scheme uses only two common-mode feedback circuits instead of three. Specifically, the first common-mode feedback circuit 100 and the third common-mode feedback circuit 104 are used, or the second common-mode feedback circuit 102 and the third common-mode feedback circuit 104 are used.

For example, the first common-mode feedback circuit 100 is used to inject current at points A and B, and the third common-mode feedback circuit 104 is used to inject current at points X and Y. Alternatively, the first common-mode feedback circuit 100 is used to inject current at points A and B, and the third common-mode feedback circuit 104 is used to inject current at point Z. Another implementation may be to use the second common-mode feedback circuit 102 to inject current at point C and to use the third common-mode feedback circuit 104 to inject current at points X and Y. Yet another alternative may be to use the second common-mode feedback circuit 102 to inject current at point C and to use the third common-mode feedback circuit 104 to inject current at point Z.

Only one pair of transimpedance output voltages such as $V_{x+}$ and $V_{x-}$ is directly monitored by using the input common-mode feedback circuit 100 or 102. The other pair of transimpedance output voltages such as $V_{XL+}$ and $V_{XL-}$ may be indirectly monitored by sensing the voltages $V_{out+}$ and $V_{out-}$ using the third common-mode feedback circuit 104.

Figure 14:
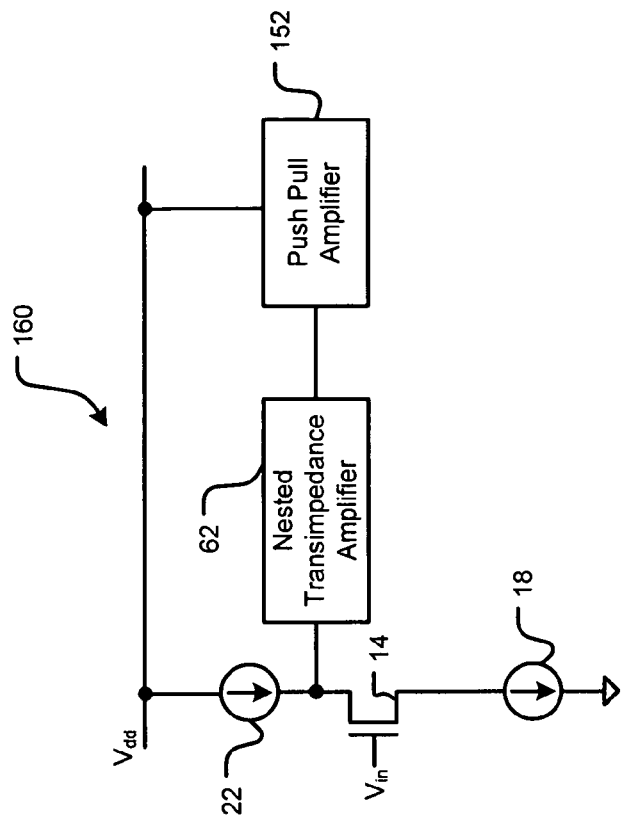
FIG. 14 is an electrical schematic and functional block diagram of an exemplary amplifier including a nested transimpedance amplifier and a push-pull amplifier according to the present invention.
Figure 13:
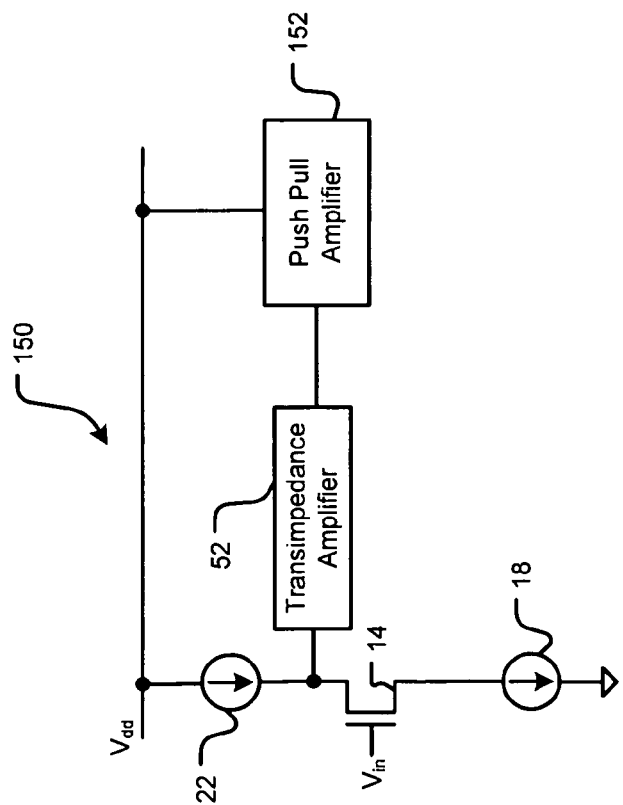
FIG. 13 is an electrical schematic and functional block diagram of an exemplary amplifier including a transimpedance amplifier and a push-pull amplifier according to the present invention.
Figure 15:
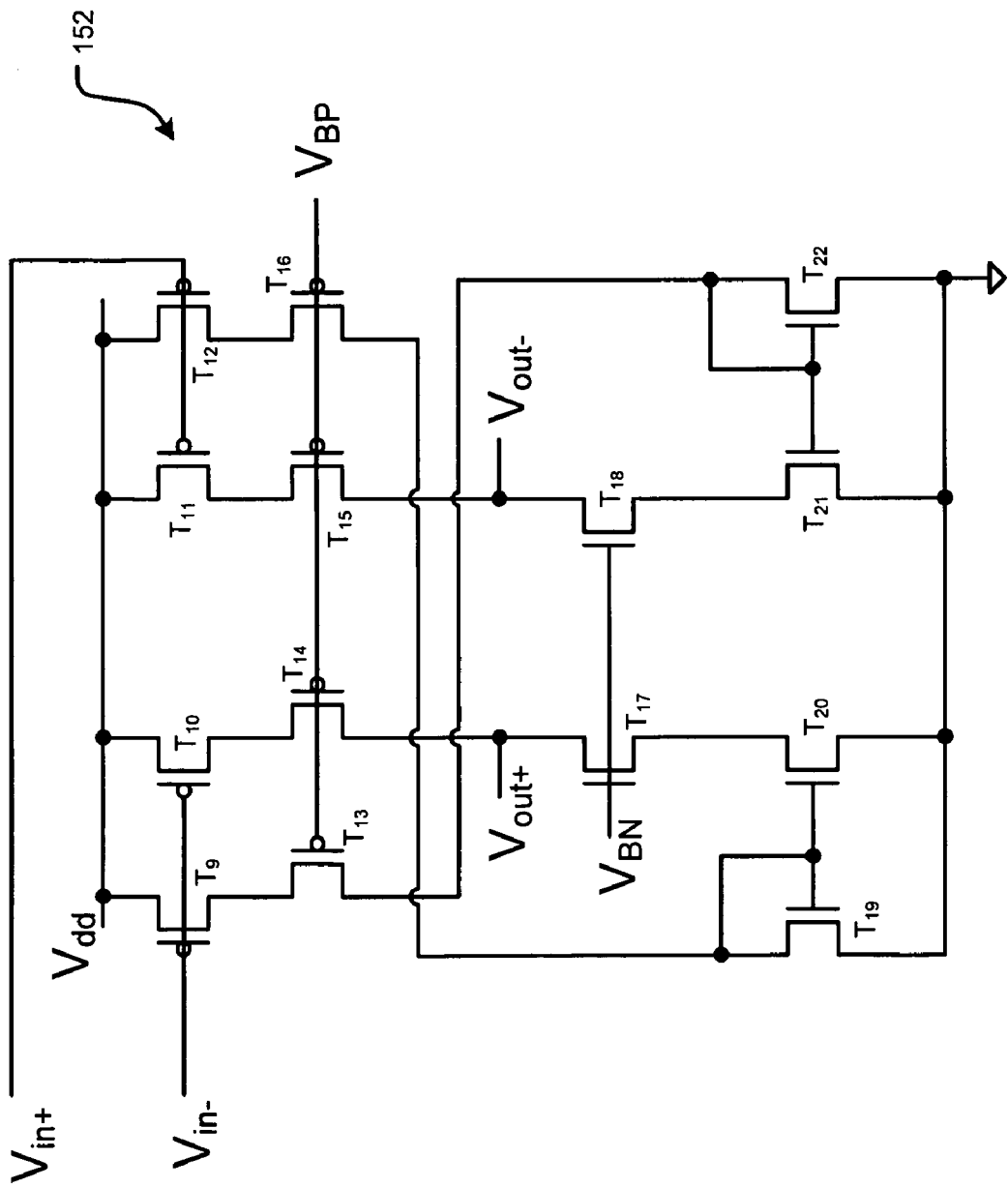
FIG. 15 is a more detailed exemplary electrical schematic of the push-pull amplifier of FIGS. 13 and 14.

Referring now to FIGS. 13-15, an amplifier 150 comprises the transimpedance amplifier 52 and a push-pull amplifier 152. In FIG. 14, an amplifier 160 comprises the nested transimpedance amplifier 62 and the push-pull amplifier 152. The push-pull amplifier 152 increases efficiency and decreases power consumption/dissipation of the amplifiers 150 and 160. Decreased power consumption/dissipation increases thermal stability of other circuits in an integrated circuit. Consequently, circuit density in a given area of a silicon wafer can be increased. In FIG. 15, an exemplary electrical schematic of a differential implementation of the push-pull amplifier 152 is shown.

Figure 16:
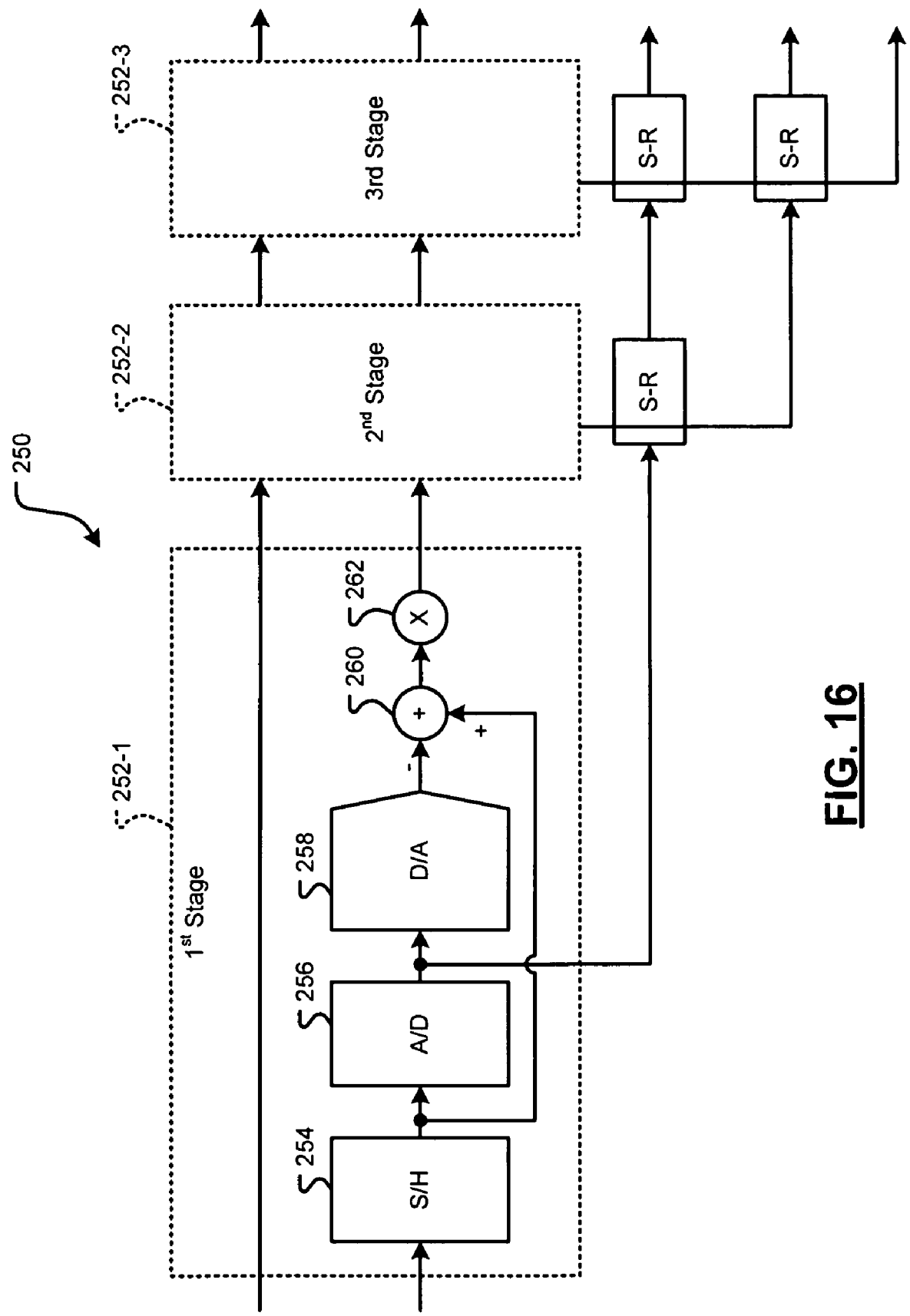
FIG. 16 is an exemplary electrical schematic and functional block diagram of a pipelined A/D converter according to the present invention.

Referring now to FIG. 16, a pipelined A/D converter (ADC) 250 includes in one or more stages thereof one of the amplifiers shown in FIGS. 3-15. The ADC 250 includes a plurality of cascaded stages 252-1, 252-2, 252-3 (collectively 252). Each of the coarse ADC stages 252 includes a sample-and-hold module 254 that samples and holds an analog output signal from a prior stage, a low resolution A/D subconverter module 256 that converts a held analog signal, a low resolution D/A subconverter module 258 that converts a resulting digital output back into an analog representation, a difference module 260, and an analog interstage difference amplifier module 262 that amplifies a residue. The residue is a difference between the held analog signal and a reconstructed analog signal.

The first stage 252-1 of the pipelined ADC 250 operates on a most current analog input sample while the second stage 252-2 operates on an amplified residue of a previous input sample. Generally, linearity and resolution of the ADC 250 are limited by factors such as gain error of the interstage amplifier 262. For example, an interstage gain error causes missing codes when the interstage gain is low.

When the number of bits resolved in each stage is high, the required interstage gain is also high. Thus, an opamp with a high GBW product can increase the linearity and the resolution of the ADC 250. The amplifiers shown in FIGS. 3-15 are very suitable for use in one or more stages of the ADC 250 because the GBW product of these amplifiers is very high.

Figure 17B:
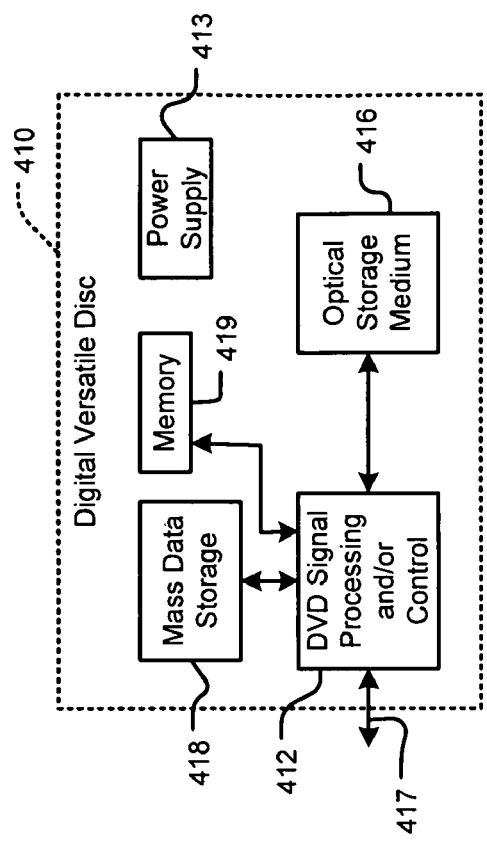
FIG. 17B is a functional block diagram of a digital versatile disk (DVD)
Figure 17A:
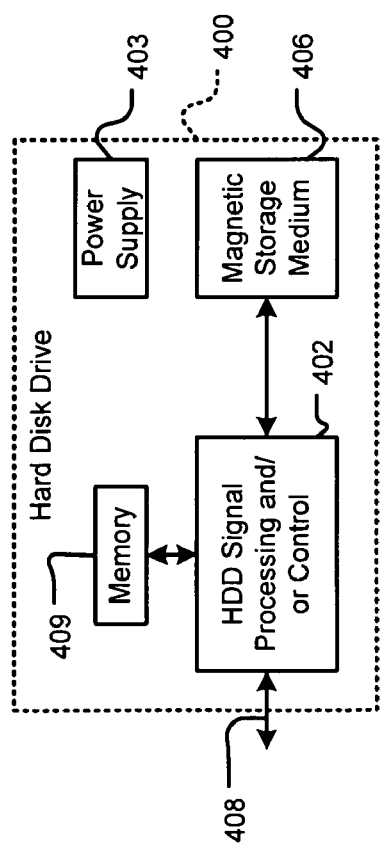
FIG. 17A is a functional block diagram of a hard disk drive.

Referring now to FIGS. 17A-17G, various exemplary implementations of the present invention are shown. Referring now to FIG. 17A, the present invention can be implemented in amplifiers, D/A or A/D converters in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 17B, the present invention can be implemented in amplifiers, D/A or A/D converters in a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 412. The DVD 410 may communicate with mass data storage 418 that stores data in a nonvolatile manner. The mass data storage 418 may include a hard disk drive (HDD). The HDD may have the configuration shown in FIG. 17A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 17D:
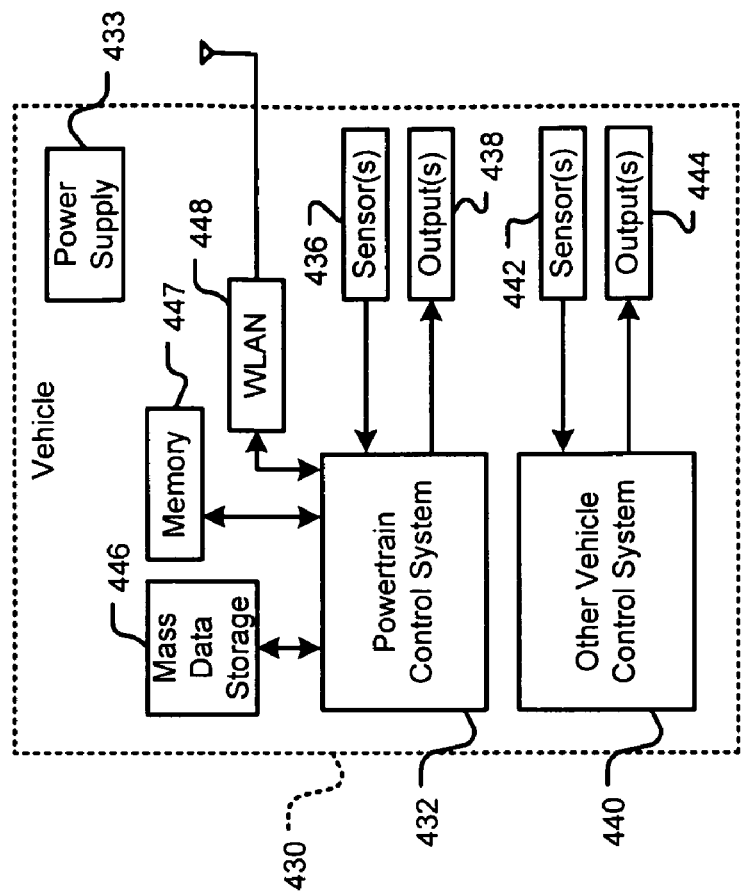
FIG. 17D is a functional block diagram of a vehicle control system.
Figure 17C:
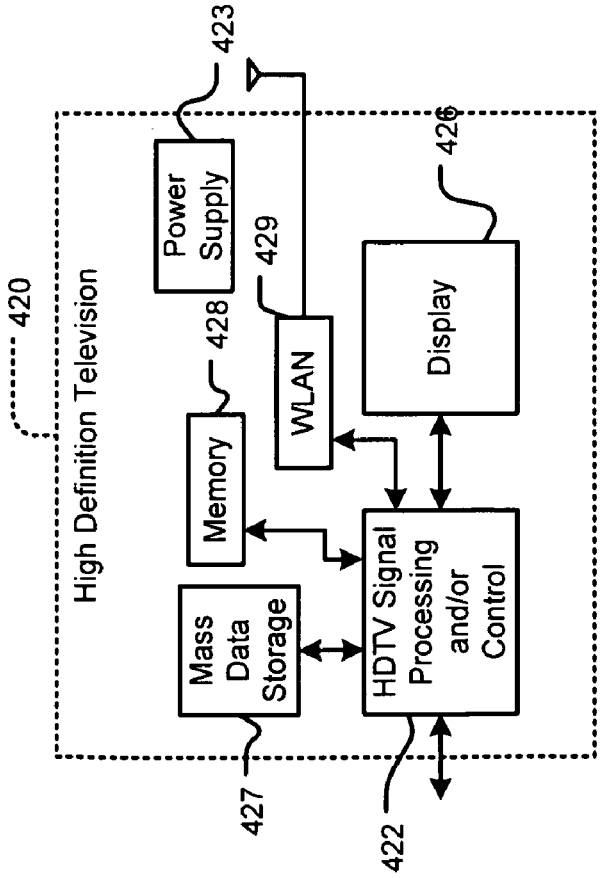
FIG. 17C is a functional block diagram of a high definition television.

Referring now to FIG. 17C, the present invention can be implemented in amplifiers, D/A or A/D converters in a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 17A and/or at least one DVD may have the configuration shown in FIG. 17B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 17D, the present invention may implement and/or be implemented in amplifiers, D/A or A/D converters in a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8"The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 17E:
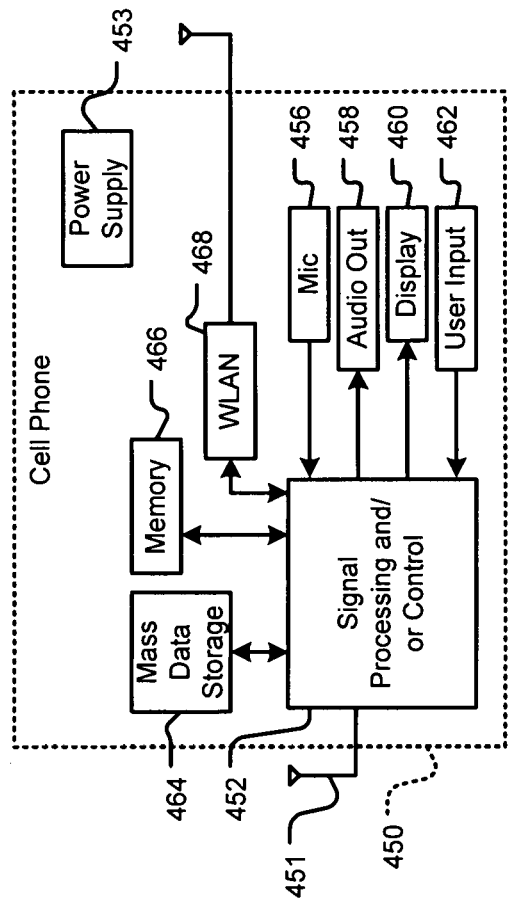
FIG. 17E is a functional block diagram of a cellular phone.

Referring now to FIG. 17E, the present invention can be implemented in amplifiers, D/A or A/D converters in a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8"The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 17F:
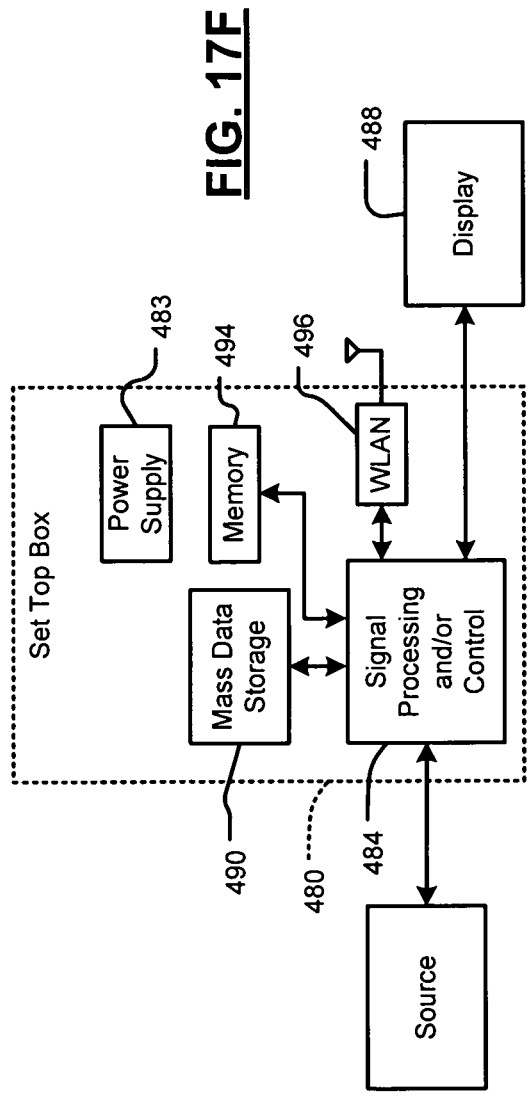
FIG. 17F is a functional block diagram of a set top box.

Referring now to FIG. 17F, the present invention can be implemented in amplifiers, D/A or A/D converters in a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8"The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 17G:
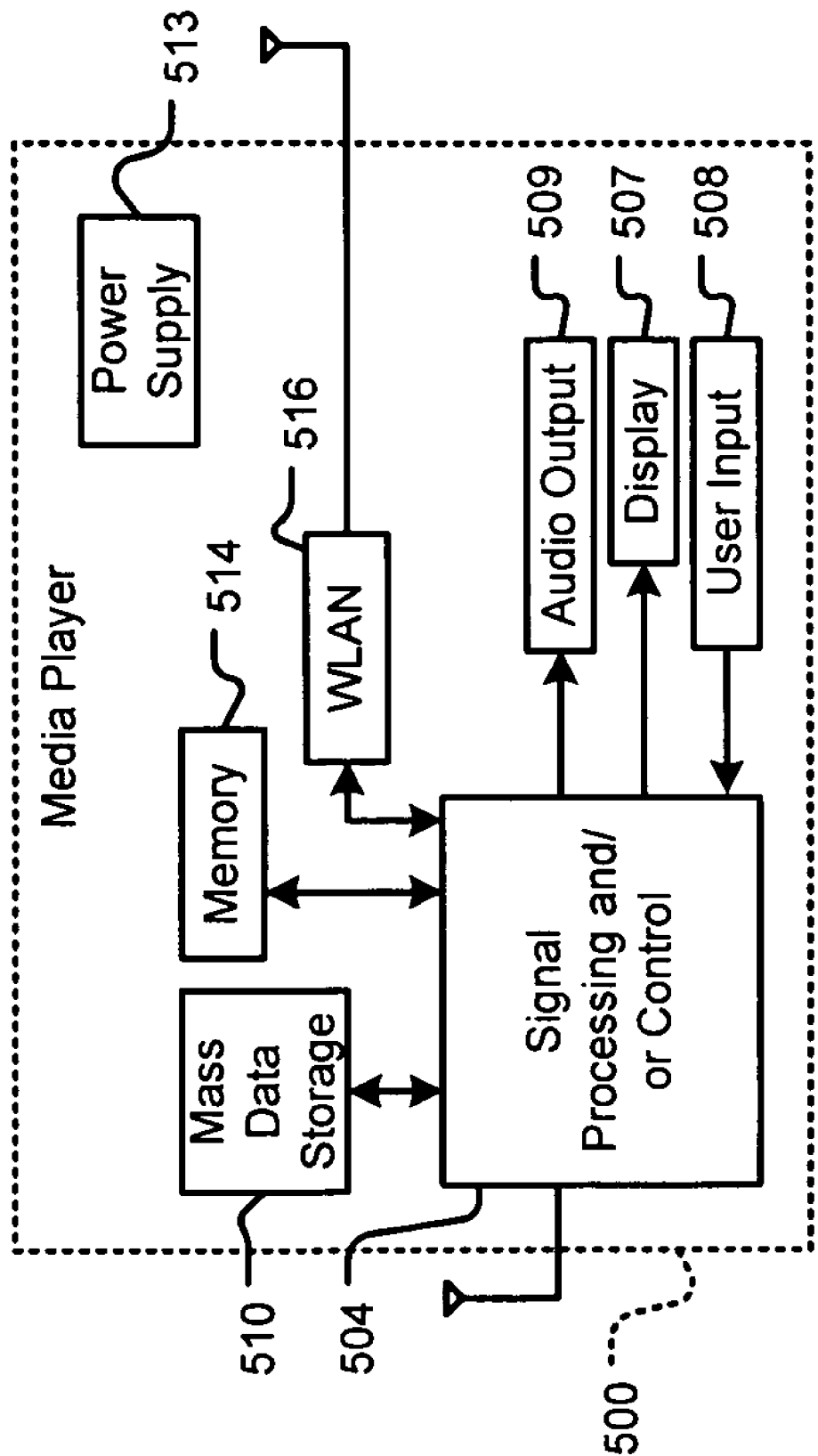
FIG. 17G is a functional block diagram of a media player.

Referring now to FIG. 17G, the present invention can be implemented in amplifiers, D/A or A/D converters in a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8"The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier circuit, comprising:
    a first transistor having a control terminal that receives a first amplifier input, a first terminal, and a second terminal;
    a transimpedance amplifier having an input that is directly connected to the first terminal of the first transistor, and an output; and
    an output amplifier having an input that is connected to the output of the transimpedance amplifier and an output, wherein the output amplifier comprises at least one of an operational amplifier, a telescopic cascoded amplifier and a push-pull amplifier.

2. The amplifier circuit of claim 1, further comprising a first load that is connected to the first terminal of the first transistor.

3. The amplifier circuit of claim 1, further comprising a current source that is connected to the second terminal of the first transistor.

4. The amplifier circuit of claim 1, wherein the transimpedance amplifier comprises a nested trans impedance amplifier.

5. The amplifier circuit of claim 1, wherein the telescopic cascoded amplifier comprises:
- an input transistor having a control terminal that is connected to the output of the transimpedance amplifier, a first terminal, and a second terminal;
- an output transistor having a first terminal that is connected to the second terminal of the input transistor, a control terminal, and a second terminal that is connected to the output of the output amplifier; and
- an output current source that is connected to the second terminal of the output transistor.

6. An analog-to-digital converter (ADC) comprising N cascaded ADC stages, where N is a integer, wherein at least one of the cascaded ADC stages comprises the amplifier circuit of claim 1.

7. An amplifier circuit comprising:
- a first transistor having a control terminal that receives a first amplifier input, a first terminal, and a second terminal;
- a second transistor having a control terminal that receives a second amplifier input, a first terminal, and a second terminal that is connected to the second terminal of the first transistor;
- a differential transimpedance amplifier having a first input that is directly connected to the first terminal of the first transistor, a second input that is directly connected to the first terminal of the second transistor, a first output, and a second output; and
- a differential output amplifier having a first input that is connected to the first output of the differential transimpedance amplifier, a second input that is connected to the second output of the differential transimpedance amplifier, a first output, and a second output,
- wherein the differential transimpedance amplifier comprises a nested differential transimpedance amplifier.

8. The amplifier circuit of claim 7, further comprising a second load that is connected to the first terminal of the second transistor.

9. The amplifier circuit of claim 7, wherein the differential output amplifier comprises a differential operational amplifier.

10. The amplifier circuit of claim 7, wherein the differential output amplifier comprises a differential telescopic cascoded amplifier.

11. The amplifier circuit of claim 7, wherein the differential output amplifier comprises a differential push-pull amplifier.

12. An analog-to-digital converter (ADC) comprising N cascaded ADC stages, where N is an integer, wherein at least one of the cascaded ADC stages comprises the amplifier circuit of claim 7.

13. The amplifier circuit of claim 1, wherein the output of the output amplifier has a first voltage that is greater than a second voltage of the output of the transimpedance amplifier.

14. The amplifier circuit of claim 1, wherein the input of the output amplifier is directly connected to the output of the transimpedance amplifier.

15. An amplifier circuit, comprising:
- a first transistor having a control terminal that receives a first amplifier input, a first terminal, and a second terminal;
- a transimpedance amplifier having an input that is directly connected to the first terminal of the first transistor, and an output; and an output amplifier having an input that is connected to the output of the transimpedance amplifier and an output,
- wherein the transimpedance amplifier comprises a nested transimpedance amplifier.

* * * * *